US010909945B2

(12) United States Patent
Li et al.

(10) Patent No.: US 10,909,945 B2
(45) Date of Patent: Feb. 2, 2021

(54) METHOD AND APPARATUS FOR PIXEL DRIVE CONTROL, DISPLAY PANEL AND STORAGE MEDIUM (71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Kun Li, Beijing (CN); Jie Cao, Beijing (CN); Yueyuan Zhang, Beijing (CN); Hui Sun, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/426,511

(22) Filed: May 30, 2019

(65) Prior Publication Data

US 2020/0168174 A1 May 28, 2020

(30) Foreign Application Priority Data

Nov. 23, 2018 (CN) .......................... 2018 1 1409110

(51) Int. Cl.
*G09G 3/36* (2006.01)
*H01L 27/12* (2006.01)
(52) U.S. Cl.
CPC ......... *G09G 3/3688* (2013.01); *H01L 27/124* (2013.01); *G09G 2310/02* (2013.01)
(58) Field of Classification Search
CPC ... G09G 3/3688; G09G 3/3674; H01L 27/124
See application file for complete search history.

(56) References Cited

U.S. PATENT DOCUMENTS

2008/0007551 A1* 1/2008 Kim .................... G09G 3/3275
345/214
2008/0100602 A1* 5/2008 Arai .................... G09G 3/3614
345/205
(Continued)

FOREIGN PATENT DOCUMENTS

CN        102314838 A    1/2012
CN        102446484 A    5/2012
(Continued)

OTHER PUBLICATIONS

Notice of First Review Opinion and English language translation, CN Application No. 201811409110.8, dated Jul. 2, 2020, 13 pages.

*Primary Examiner* — Kevin M Nguyen
(74) *Attorney, Agent, or Firm* — Myers Bigel, P.A.

(57) ABSTRACT

Embodiments of the present disclosure provide a method and apparatus for pixel drive control, a display panel and a storage medium. The method includes generating a drive control signal based on display data of target columns of sub-pixels and corresponding target display brightnesses. The drive control signal includes sub-drive control signals having at least two duty cycles. The method includes controlling a pixel drive circuit to output a corresponding pixel drive signal based on the drive control signal. The pixel drive signal includes sub-drive signals having at least two duty cycles corresponding to respective sub-drive control signals. Embodiments of the present disclosure enables different rows of sub-pixels to be driven by signals having different duty cycles, thereby achieving adjustment of charging time for different rows of sub-pixels, to reduce charging difference for rows of sub-pixels and enable their display brightnesses to become uniform.

14 Claims, 5 Drawing Sheets

(56) References Cited

U.S. PATENT DOCUMENTS

| | | | |
|---|---|---|---|
| 2011/0205260 A1* | 8/2011 | Weng | G09G 3/3648 |
| | | | 345/691 |
| 2012/0081349 A1 | 4/2012 | Tomita | |
| 2012/0105405 A1* | 5/2012 | Hsiao | G09G 3/3674 |
| | | | 345/208 |
| 2014/0160186 A1* | 6/2014 | Oh | G09G 3/3648 |
| | | | 345/694 |
| 2015/0077442 A1* | 3/2015 | Ogawa | G09G 3/344 |
| | | | 345/690 |
| 2015/0145973 A1 | 5/2015 | Fang | |
| 2017/0316748 A1* | 11/2017 | Shim | G09G 3/3674 |
| 2018/0240399 A1 | 8/2018 | Lin et al. | |

FOREIGN PATENT DOCUMENTS

| | | |
|---|---|---|
| CN | 103606358 A | 2/2014 |
| CN | 108470536 A | 8/2018 |
| KR | 20070071496 A | 7/2007 |

\* cited by examiner

Prior Art

FIG. 9

METHOD AND APPARATUS FOR PIXEL DRIVE CONTROL, DISPLAY PANEL AND STORAGE MEDIUM

CROSS REFERENCE TO RELATED APPLICATION

The present application claims the benefit of Chinese patent application No. 201811409110.8 filed on Nov. 23, 2018, the entire disclosure of which is incorporated herein by reference.

FIELD

The present disclosure relates to the technical field of display, and particularly to a method and apparatus for controlling pixel driving, a display panel and a storage medium.

BACKGROUND

A TFT-LCD (Thin Film Transistor-Liquid Crystal Display) charges each pixel in its display panel during operation to realize a display feature of pixels. The charging of the liquid crystal in a respective pixel is achieved by allowing a display electrode and a common electrode to jointly form charging electrodes. In an ideal TFT-LCD driving model, the driving signals are symmetrically distributed with reference to the common electrode voltage Vcom. The voltages of the display electrode are also symmetrically distributed with reference to Vcom, forming positive polarity voltages and negative polarity voltages for pixel charging.

In practical applications, due to a feedthrough of a thin film transistor, the positive polarity voltages and the negative polarity voltages are asymmetrical. In order to solve the problem caused by the asymmetry of the positive polarity voltages and the negative polarity voltages, a Z-inversion or Z Dot Inversion driving mode may be employed for driving. However, for a specific picture, Z-inversion may result in horizontal stripes, which seriously affects the quality of the displayed picture.

SUMMARY

In a first aspect, embodiments of the present disclosure provide a method for controlling pixels driving. The pixels comprise sub-pixels. The method comprises: generating a drive control signal based on display data of target columns of sub-pixels in a display panel and a difference between corresponding target display brightnesses; the drive control signal comprising sub-drive control signals having at least two duty cycles; controlling a pixel drive circuit to output a corresponding pixel drive signal based on the drive control signal; the pixel drive signal comprising sub-drive signals having at least two duty cycles corresponding to respective sub-drive control signals.

Optionally, the target columns of sub-pixels comprise odd rows of sub-pixels in a first column of sub-pixels and even rows of sub-pixels in a second column of sub-pixels connected in a column direction by a data line for pixel driving, and the first and second columns of sub-pixels are two neighboring columns of sub-pixels. Generation of the drive control signal comprises: generating an initial drive control signal based on the display data; and adjusting duty cycles of the sub-drive control signals in the initial drive control signal to generate an adjusted drive control signal, when the display data of sub-pixels belonging to neighboring rows and sequentially connected by the data line indicates that a difference between the target display brightnesses corresponding thereto exceeds a threshold.

Optionally, an adjustment proportion of a duty cycle is determined based on the difference between the target display brightnesses of the sub-pixels belonging to neighboring rows.

Optionally, generation of the drive control signal comprises: generating a first drive control signal based on the display data as the initial drive control signal; generating a second drive control signal based on the difference between the target display brightnesses of the sub-pixels belonging to neighboring rows; adjusting the first drive control signal based on the second drive control signal to obtain the adjusted drive control signal including sub-drive control signals of a first duty cycle and a second duty cycle.

Optionally, adjustment of the first drive control signal based on the second drive control signal comprises performing XOR processing on the first drive control signal and the second drive control signal.

Optionally, generation of the second drive control signal based on the difference between the target display brightnesses of the sub-pixels belonging to neighboring rows comprises: calculating charging time required for respective rows of sub-pixels in the target columns of sub-pixels based on the difference between the target display brightnesses, and determining duty cycles of corresponding sub-drive control signals in the second drive control signal based on the calculated charging time.

In a second aspect, embodiments of the present disclosure provide an apparatus for controlling pixels driving. The apparatus comprises a signal generator and a signal transmitter. The signal generator is configured to generate a drive control signal based on display data of target columns of sub-pixels and a difference between corresponding target display brightnesses. The drive control signal comprises sub-drive control signals having at least two duty cycles. The signal transmitter is configured to transmit the drive control signal to a pixel drive circuit to control the pixel drive circuit to output a corresponding pixel drive signal. The pixel drive signal comprises sub-drive signals having at least two duty cycles corresponding to respective sub-drive control signals.

In a third aspect, embodiments of the present disclosure provide a display panel comprising pixels, a pixel drive circuit, and the abovementioned apparatus for providing the pixel drive signal to the pixel drive circuit. The pixels include a plurality of sub-pixels. The pixel drive circuit for charging and discharging the sub-pixels based on a pixel drive signal.

In a fourth aspect, embodiments of the present disclosure provide a computer readable storage medium storing a computer program, wherein the computer program, when executed by a processor, implements the method described above.

BRIEF DESCRIPTION OF THE DRAWINGS

The above and/or additional aspects and advantages of the present disclosure will become apparent and readily understood from the following depictions of embodiments with reference to figures, in which.

DETAILED DESCRIPTION

The present disclosure will be described in detail below. Examples of embodiments of the present disclosure are illustrated in the figures, wherein the same or like reference numerals are used to denote the same or like components or components having the same or like functions. Furthermore, if a detailed description of a known technique is unnecessary for shown features of the present disclosure, it will be omitted. The embodiments described below with reference to the figures are exemplary, and only intended to illustrate the present disclosure, and cannot be construed as limiting the present disclosure.

Those skilled in the art will appreciate that all terms (including technical and scientific terms) used herein have the same meaning as commonly understood by those of ordinary skill in the art to which this disclosure belongs, unless otherwise defined. It should also be appreciated that terms such as those defined in a general dictionary should be understood to have meanings that are consistent with the meaning in the context of the related art, and will not be explained in an idealized or excessively formal meaning unless specifically defined.

Those skilled in the art may appreciate that singular forms "a", "an", "said" and "the" may also include plural forms unless otherwise stated particularly. It should be further appreciated that the word "comprise" used in the description of the present disclosure refers to existence of the features, integers, steps, operations, elements and/or assemblies, but does not exclude existence or addition of one or more other features, integers, steps, operations, elements, assemblies and/or groups thereof. It should be understood that when an element is "connected" or "coupled" to another element, the element may be connected or coupled to the other element directly, or via an intermediate element. In addition, the "connected" or "coupled" used herein may include a wireless connection or a wireless coupling. The word "and/or" used herein includes all or any unit and all combinations of one or more associated listed items.

Figure 1:
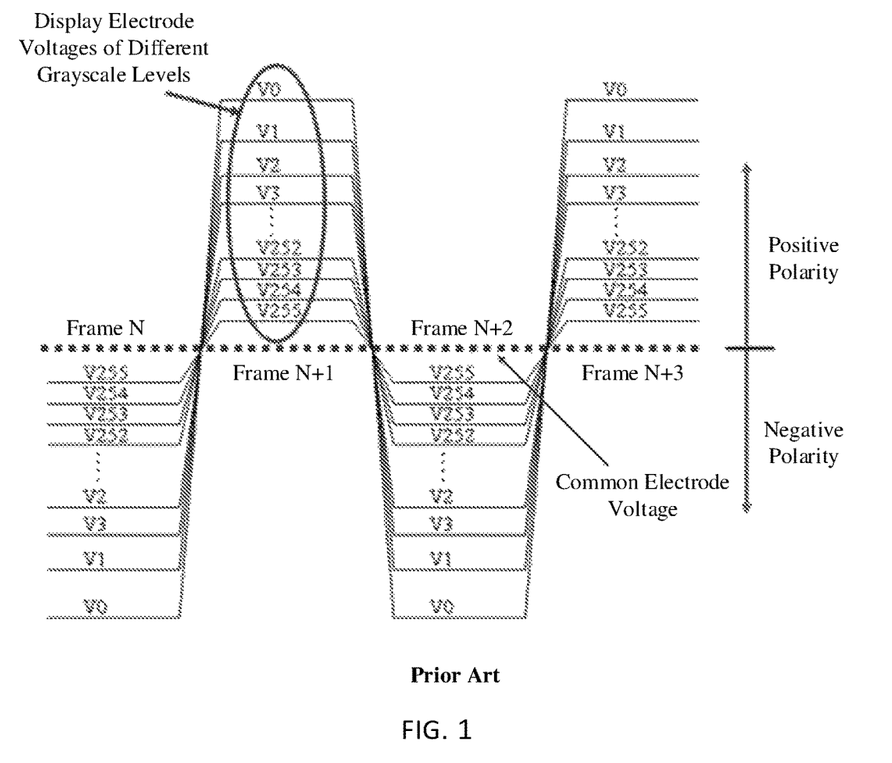
FIG. 1 is a schematic view showing symmetric distribution of display electrode voltages in the related art.

FIG. 1 shows a schematic view showing symmetric distribution of display electrode voltages in the related art. As shown in FIG. 1, in an ideal TFT-LCD driving model, drive signals of two neighboring frames (for example, frame N and frame N+1) are symmetrically distributed with reference to a common electrode voltage Vcom. Correspondingly, voltages V0, V1, V2, ..., V255 of a display electrode are also symmetrically distributed with reference to Vcom, thereby forming positive polarity voltages higher than Vcom and negative polarity voltages lower than Vcom, wherein V0, V1, V2, ... V255 respectively correspond to the display electrode voltages of different grayscale levels.

In practical application, since a parasitic capacitance effect between a gate and a drain in a TFT causes the voltage of the display electrode to be affected by a feed through effect, which incurs a problem caused by asymmetry of positive and negative pixel voltages. To solve the problem, many specific driving modes, for example, Z-inversion, are formed.

Figure 2:
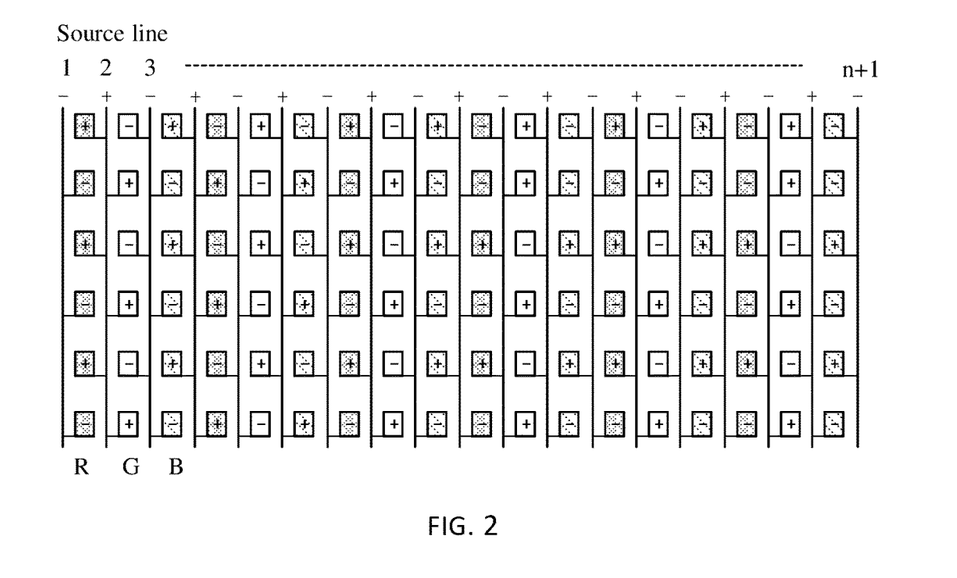
FIG. 2 is a schematic view showing a Z-inversion driving mode in the related art.

FIG. 2 shows a schematic diagram of the Z-inversion driving mode. As shown in FIG. 2, the display panel may include a plurality of pixels, and each of the pixels may include a plurality of sub-pixels, for example, sub-pixels correspond to different colors, which may be arranged side by side. These sub-pixels are arranged in a certain row/column pattern. In the Z-inversion driving mode, each signal line (also referred to as a source line or a data line) between two groups (for example, two columns) of sub-pixels is connected, in a first direction (e.g., the column direction), to pixels in the two groups neighboring, in a second direction (e.g., the row direction) thereto (e.g., two neighboring columns in FIG. 2) in an interleaving/alternate way. The pixel voltages corresponding to sub-pixels connected to each source line have the same polarity. The pixel voltages corresponding to two neighboring sub-pixels (which belong to respective neighboring rows) in each group (for example, each column) of sub-pixels have opposite polarities.

For example, a second source line in FIG. 2 is sequentially connected to a first (i.e., belonging to a first row) red sub-pixel (R) in a first column, a second (belonging to a second row) green sub-pixel (G) in a second column, and a third (i.e., belonging to a third row) red sub-pixel in the first column, and so on so forth. The pixel voltages of these sub-pixels all have a positive polarity. A third source line in FIG. 2 is sequentially connected to a first (i.e., belonging to the first row) G sub-pixel in a second column, a second (i.e., belonging to the second row) blue sub-pixel (B) in a third column, a third (i.e., belonging to a third row) G sub-pixel in the second column, and so on so forth. The pixel voltages of these sub-pixels all have a negative polarity. Other source lines are also connected in the same way.

It may be understood that although the corresponding sub-pixel categories (i.e., R, G, or B) are marked only in the first three columns of sub-pixels in FIG. 2, the sub-pixels of other columns may also be arranged cyclically, similarly to the arrangement rule of the RGB sub-pixels of the first three columns of sub-pixels. In other words, the RGB pattern cyclically repeats across the sub-pixels of the source line.

The Inventors have found that when the Z-inversion mode shown in FIG. 2 is adopted, a conventional driving method would make charging time of each row of sub-pixels the same. However, applying same charging time for a particular picture is apt to cause some rows to be undercharged, while other rows are overcharged, which in turn causes an inter-row charging difference and thus causes horizontal stripes. This will seriously affect the quality of the picture.

Figure 3:
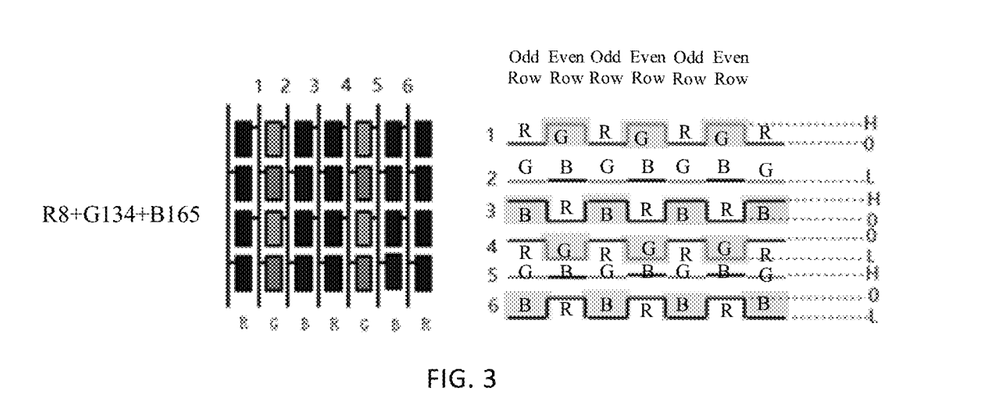
FIG. 3 is a diagram showing an example in which Z-inversion generates an inter-row charging difference.

FIG. 3 shows an exemplary inter-row charging difference caused by the Z-inversion. In FIG. 3, numbers 1-6 exemplarily identify corresponding six source lines (Source 1-Source 6), and each pixel is divided into three (red, green, blue) sub-pixels arranged side by side. It is assumed that display data (for example, grayscale mode) for each sub-pixel shown in FIG. 3 is R8+G134+B165, that is, the grayscale level of the red sub-pixel is 8, and the grayscale level of the green sub-pixel is 134, and the grayscale level of the blue sub-pixel is 165. In FIG. 3, the grayscale voltage is represented by 0, H, and L, wherein H represents a positive polarity voltage and L represents a negative polarity voltage. The grayscale values 134 and 165 of the positive and negative polarities may be represented approximately by grayscale voltages H and L respectively, and the grayscale value 8 may be represented approximately by the grayscale voltage 0. Here, display brightness of the sub-pixel varies with its display data (for example, grayscale). Exemplarily, the smaller the grayscale value of a sub-pixel is, the lower its display brightness is, whereas the larger the grayscale value is, the higher the display brightness is.

In practical application, when the voltage for the neighboring rows of sub-pixels on the source line changes from 0 to H or from 0 to L, data delay is easily caused due to a sudden change in the data voltage. This might in turn cause insufficient charging of sub-pixels.

As can be seen from FIG. 3, in the pixel grayscale mode of R8+G134+B165, taking the source lines numbered 1 and 4 (Source 1 and Source 4) as an example, the grayscale level of the red sub-pixel is 8 (i.e., R8) in the odd rows and connected by Source 1 and Source 4 are substantially not bright due to a lower grayscale voltage. The grayscale level of the red sub-pixels in the odd rows (i.e., rows 1, 3, and 5 as shown in FIG. 3) in a pixel grayscale mode of R8+G134+B165 in FIG. 3 is 8 (a low grayscale voltage). As such, when the voltage on the source lines jumps from 0 to H (corresponding to Source 1) or L (corresponding to Source 4) of the green sub-pixels (G134) in neighboring even rows and connected by same source lines, the green sub-pixels are liable to exhibit a lower display brightness due to insufficient charging. Similarly, taking the source lines numbered 3 and 6 (Source 3 and Source 6) as an example, the red sub-pixels (R) in even rows and connected by Source 3 and Source 6 are also substantially not bright. Similarly, when the voltage on the source line jumps from 0 to H (corresponding to Source 3) or L (corresponding to Source 6) of the blue sub-pixels (B165) in neighboring odd rows and connected by same source lines, the blue sub-pixels are liable to exhibit a lower display brightness due to insufficient charging.

Figure 4:
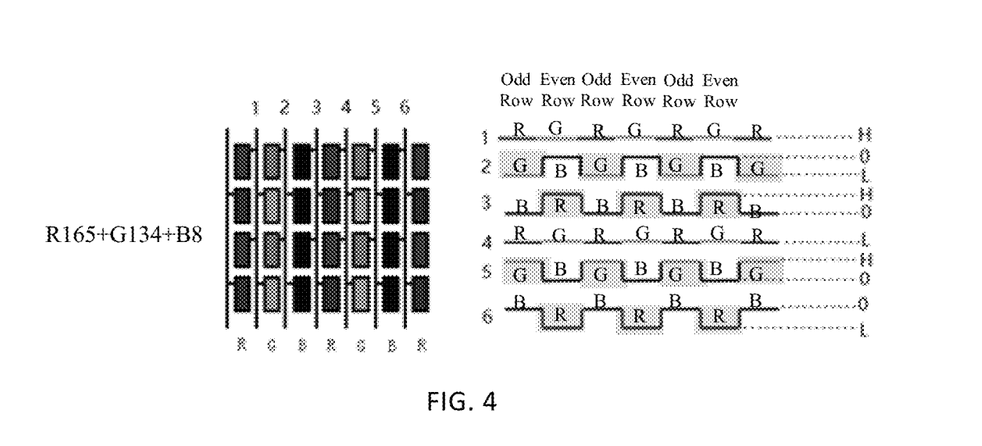
FIG. 4 is a diagram showing another example in which Z-inversion generates an inter-row charging difference.

FIG. 4 shows another exemplary inter-row charging difference caused by the Z-inversion. It is assumed that the pixel grayscale mode shown in FIG. 4 is R165+G134+B8, that is, the grayscale level of the red sub-pixel is 165, the grayscale level of the green sub-pixel is 134, and the grayscale level of the blue sub-pixel is 8. Similar to FIG. 3, in FIG. 4, 0, H, and L are used to represent the grayscale voltages, H represents the positive polarity voltage, and L represents the negative polarity voltage.

As can be seen from FIG. 4, since the blue sub-pixel is substantially not bright (i.e., the grayscale voltage is 0), the red sub-pixels in the even row neighboring thereto and the green sub-pixels in the odd row neighboring thereto and connected by same source lines are liable to exhibit a lower display brightness due to insufficient charging.

As can be seen from the two examples shown in FIG. 3 and FIG. 4, different impacts will be caused on charging duration of the sub-pixels, when grayscale voltage differences of neighboring rows of sub-pixels sequentially connected by a source line are different. This might cause a difference of display brightnesses for sub-pixels having the same grayscale voltage due to existence of the charging difference.

In FIG. 3 and FIG. 4, the difference of display brightnesses occurs between two rows of sub-pixels having the same grayscale, that is, horizontal stripes appear. In particular, since the human eyes are most sensitive to the brightness of green, the human eyes perceive the horizontal stripes most strongly when horizontal stripes occur due to different display brightnesses of neighboring two rows of green sub-pixels. This seriously affects the user experience.

The pixel drive control solution provided by the present disclosure mitigates or alleviates the above problems in the related art.

According to some embodiments of the present disclosure, by generating a drive control signal including at least two duty cycles based on display data of target columns of sub-pixels and corresponding target display brightnesses, and controlling a pixel drive circuit based on the drive control signal, the pixel drive signal output by the pixel drive circuit may also include at least two duty cycles. As such, adjustment of charging time for different rows of sub-pixels can be realized by enabling the sub-pixels in different rows to be driven by drive signals having different duty cycles. In this way, charging difference between rows of sub-pixels currently caused by fixed charging time is reduced so that the display brightnesses of rows of sub-pixels tends to be consistent, thereby improving the quality of displayed pictures and user experience.

Figure 5:
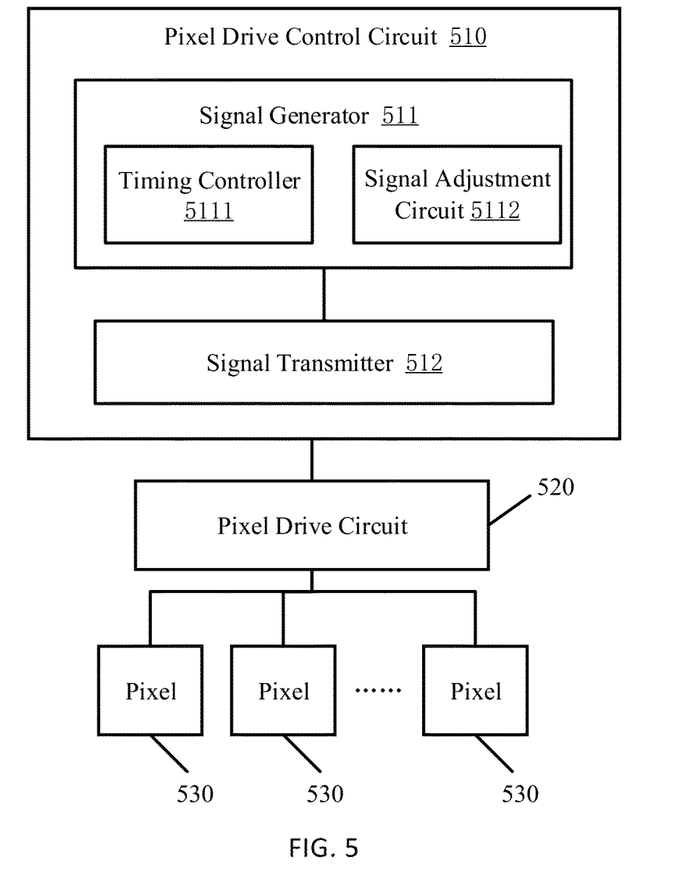
FIG. 5 is a schematic diagram of a structural framework of a display panel according to an embodiment of the present disclosure.

FIG. 5 illustrates a display panel provided by an embodiment of the present disclosure. As shown in FIG. 5, the display panel includes a pixel drive control circuit 510, a pixel drive circuit 520, and a plurality of pixels 530. The pixel drive circuit 520 is electrically connected to the pixel drive control circuit 510 and the pixels 530, respectively.

The pixel drive control circuit 510 is configured to: generate a drive control signal based on display data of target columns of sub-pixels and corresponding target display brightnesses; and control the pixel drive circuit 520 to output a corresponding pixel drive signal based on the drive control signal. The drive control signal includes sub-drive control signals having at least two duty cycles. The pixel drive signal includes sub-drive signals having at least two duty cycles corresponding to respective sub-drive control signals. The display data may be grayscale values of sub-pixels, which may be obtained from an image processing unit (GPU) for example. The target display brightness may refer to theoretical display brightness achieved when a sub-pixels is driven for display in accordance with the display data (for example, a grayscale voltage).

In some embodiments, in the Z-inversion driving mode, in a column direction, a source line (i.e. a data line) for pixel driving is alternately connected to sub-pixels in two columns of sub-pixels neighboring to it. For example, odd rows of sub-pixels in a first sub-pixel column neighboring to the source line and even rows of sub-pixels in a second sub-pixel column neighboring to the source line are sequentially connected to the source line in a Z-shaped manner. In other words, the sub-pixels sequentially connected on the source line alternately come from the odd rows in the first column of sub-pixels and the even rows in the second column of sub-pixels. The target columns of sub-pixels may include all sub-pixels connected by any source line.

The pixel drive control circuit 510 is configured to generate an initial drive control signal based on the display data of the target columns of sub-pixels, and adjust a duty cycle of the initial drive control signal to generate an adjusted drive control signal, when the display data belonging to neighboring rows of sub-pixels in the target columns of sub-pixels indicates that a difference between the target display brightnesses corresponding thereto exceeds a threshold.

Optionally, the initial drive control signal includes a plurality of sub-drive control signals having the same duty cycle. Each sub-drive control signal may correspond to a row of sub-pixels. In some embodiments, adjusting the duty cycle of the initial drive control signal may include adjusting a duty cycle of a sub-drive control signal corresponding to a current row in the initial drive control signal when the difference between the target display brightnesses of the current row of sub-pixels and a preceding row of sub-pixels exceeds a threshold.

Taking the sub-pixels shown in FIG. 3 and their display data as an example, for the data line Source 1, the display data of the first row of red sub-pixel and the second row of green sub-pixel sequentially connected by the data line Source 1 are R8 and G134, respectively. The pixel drive control circuit 510 may generate initial drive control signals for corresponding (red and green) sub-pixels respectively based on the two display data. The two display data (jump from 8 to 134) indicate that the difference between display brightnesses of neighboring rows of sub-pixels is large, that is, the driving voltage on the source line may greatly change, for example, exceed a predetermined threshold (for example, a brightness difference corresponding to a predetermined grayscale value such as 50). Therefore, according to an embodiment of the present disclosure, the pixel drive control circuit 510 may correspondingly adjust the duty cycle of the drive signal corresponding to the row where the green sub-pixel lie (e.g., the second row in this example). This adjustment will increase the charging time for the green sub-pixel, thereby offsetting the impact caused by data delay on the charging time due to sudden change in the data voltage.

Similarly, in the example shown in FIG. 3, the duty cycle of the drive signal corresponding to the row where the blue sub-pixel lies (e.g., the fourth row in this example) may also be adjusted accordingly.

In contrast, since the display data of the first row of green sub-pixels and the second row of blue sub-pixels sequentially connected by the data line Source 2 are G134 and B165, respectively, the difference between the target display brightnesses of the two rows of sub-pixels is small, that is, the change in the data voltage is small. In this case, adjustment of the duty cycle may not be performed, and the initial drive control signal may be used for driving.

In some embodiments, an adjustment proportion of the duty cycle is determined based on the difference between the target display brightnesses of neighboring rows of sub-pixels sequentially connected on the source line. Exemplarily, the brightness difference may be divided into several difference intervals, and each difference interval is made correspond to a duty cycle adjustment proportion.

The pixel drive circuit 520 may include a source driving circuit and a gate driving circuit. Correspondingly, the pixel drive signal includes a source drive signal outputted by the source driving circuit and a gate drive signal outputted by the gate driving circuit. The source drive signal may be configured to control charging of each pixel 530 via a signal line. The gate drive signal may be configured to control the ON and OFF of each pixel 530 via a scan line (also called as a gate line).

It may be appreciated that the source driving circuit and the gate driving circuit may be implemented using any applicable circuit structure in the related art.

Optionally, the drive control signal includes a source drive control signal and a gate drive control signal. The source drive control signal may be configured to control the signal output of the source driving circuit. The source drive control signal may be a latch signal of the signal output by the source driving circuit. The gate drive control signal may be configured to control the signal output of the gate driving circuit. The gate drive control signal may be a latch signal of the signal output by the gate driving circuit.

In the embodiments of the present disclosure, the duty cycles and the rising and falling tendencies of sub-drive signals in the pixel drive signal respectively correspond to the duty cycles and rising and falling tendencies of respective sub-drive control signals in the drive control signal.

Figure 6:
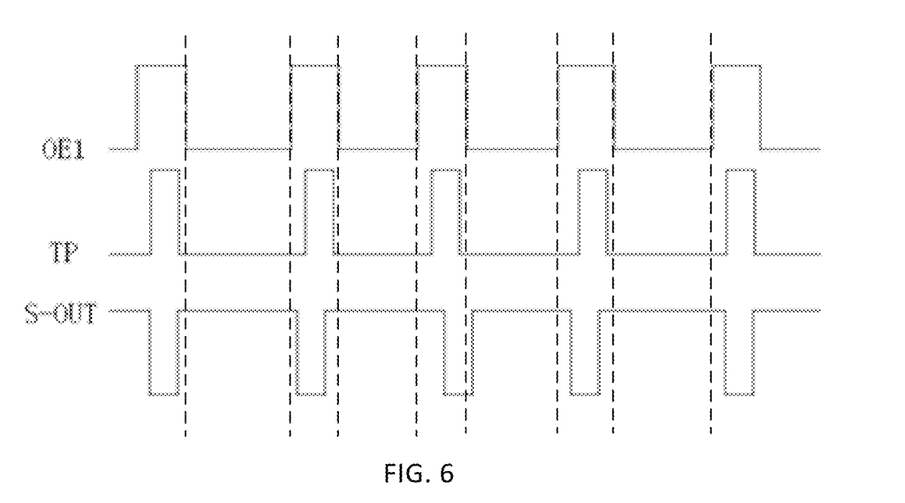
FIG. 6 is a schematic diagram of a correspondence relationship between a gate drive control signal, a source drive control signal and a source drive signal in an embodiment of the present disclosure.

FIG. 6 shows an exemplary correspondence relationship between a source drive control signal, a gate drive control signal and a source drive signal. In FIG. 6, the TP signal is the source drive control signal, such as a latch signal output from the source driving circuit. The OE1 signal is the gate drive control signal. The S-OUT signal is the source drive signal output from the source driving circuit.

As can be seen from FIG. 6, the source driving circuit outputs at the falling edge of the TP signal. At this time, the S-OUT signal is at a rising edge, that is, the source driving circuit starts outputting the source drive signal to control to start charging a corresponding pixel 530. At the rising edge of the TP signal, the source driving circuit stops outputting. At this time, the S-OUT signal is at a falling edge, that is, the source driving circuit stops outputting the source drive signal to control to stop charging the corresponding pixel 530.

Likewise, when the OE1 signal in FIG. 6 is a at falling edge, the gate driving circuit starts outputting a gate drive signal to control the corresponding pixel 530 to be turned on. When the OE1 signal in FIG. 6 is at a rising edge, the gate driving circuit stops outputting the gate drive signal to control the corresponding pixel 530 to be turned off. The charging of the pixel will stop when it is turned off. It may be understood that the charging time of a row of pixels is mainly jointly determined by the source drive control signal (for example, the TP signal) and the gate drive control signal (for example, the OE1 signal). Thus, the adjustment of the drive control signal may be achieved by adjusting the duty cycle of at least one of the gate drive control signal and the source drive control signal, thereby achieving the adjustment of the drive signal and the sub-pixel charging time.

It may be understood that the target columns of sub-pixels in the embodiments of the present disclosure may include all sub-pixels connected by any one of source lines. These sub-pixels may belong to different columns (for example, neighboring columns in the Z-inversion driving mode) and belong to different rows. For example, the target columns of sub-pixels may include red sub-pixels and green sub-pixels connected by the source line in the numeral 1 in FIG. 3 which belongs to the first and second columns and belongs to different rows.

Returning to FIG. 5, in some embodiments, the pixel drive control circuit 510 may include a signal generator 511 and a signal transmitter 512.

The signal generator 511 may be configured to generate a drive control signal based on the display data of the target columns of sub-pixels and corresponding target display brightnesses (e.g., difference between the target display brightnesses), the drive control signal including sub-drive control signals having at least two duty cycles.

The signal transmitter 512 may be configured to transmit the drive control signal to the pixel drive circuit to control the pixel drive circuit to output a corresponding pixel drive signal. The pixel drive signal includes sub-drive signals having at least two duty cycles corresponding to the sub-drive control signals.

In the Z-inversion driving mode, the target columns of sub-pixels include two neighboring columns of sub-pixels alternately and sequentially connected in the column direction by a data line for pixel driving. In some embodiments, the signal generator 511 may be configured to: generate an initial drive control signal based on the display data; and adjust the duty cycles of sub-drive control signals in the initial drive control signal to generate an adjusted drive control signal in such a way that the adjustment is based on a difference between the target display brightnesses corresponding to display data of the sub-pixels sequentially connected by the data line and belonging to neighboring rows. Optionally, the signal generator 511 may be configured to determine a adjustment proportion of the duty cycle based on the difference between the target display brightnesses of the sub-pixels belonging to the neighboring rows.

In some embodiments, the signal generator 511 may include a timing controller 5111 and a signal adjustment circuit 5112.

The timing controller 511 is configured to generate a first drive control signal based on the display data of the target columns of sub-pixels. Optionally, the timing controller 5111 may further generate a second drive control signal based on the target display brightnesses corresponding to the display data. The second drive control signal may include sub-drive control signals having different duty cycles. In some embodiments, the timing controller 5111 may generate the second drive control signal based on a difference between the target display brightnesses (e.g., characterized by a difference of display data) of sub-pixels connected by the source line and belonging to neighboring rows. Exemplarily, the second drive control signal may be a pulse signal in the form of a square wave. The timing controller 5111 may control the pulse width or polarity of the second drive control signal based on the difference between the display data of the connected neighboring rows of sub-pixels.

The signal adjustment circuit 5112 is configured to adjust the first drive control signal based on the second drive control signal to obtain an adjusted drive control signal including sub-drive control signals of a first duty cycle and sub-drive control signals of a second duty cycle.

Optionally, the timing controller 5111 may be a TCON (Timer Control Register).

Optionally, the signal adjustment circuit 5112 may be an XOR gate circuit. XOR processing may be performed on the first drive control signal and the second drive control signal through the XOR gate circuit to obtain a drive control signal including sub-drive control signals having at least a first duty cycle and a second duty cycle.

Figure 7:
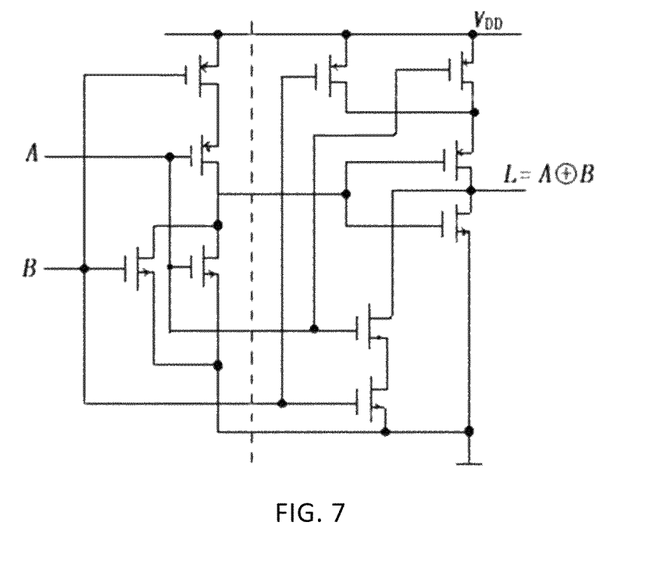
FIG. 7 is a schematic diagram of a circuit principle of an XOR gate circuit in an embodiment of the present disclosure.

In some embodiments, the XOR gate circuit may be formed by a plurality of N-type MOS (MOSFET, Metal-Oxide-Semiconductor Field-Effect Transistor) and/or a plurality of P-type MOS. An optional XOR gate structure is shown in FIG. 7. An input terminal A and an input terminal B of the XOR gate circuit shown in FIG. 7 are both electrically connected to a timing controller 5111 and respectively configured to receive a first drive control signal and a second drive control signal generated and transmitted by the timing controller. An output terminal L of the XOR gate circuit shown in FIG. 7 is electrically connected to a pixel drive circuit 520 to output an adjusted drive control signal. A power supply terminal VDD is electrically connected to an external power supply.

A truth table of the XOR gate circuit shown in FIG. 7 may be as shown in the following table:

| Input A | Input B | Output L |
|---------|---------|----------|
| 0       | 0       | 0        |
| 0       | 1       | 1        |

-continued

| Input A | Input B | Output L |
|---------|---------|----------|
| 1       | 0       | 1        |
| 1       | 1       | 0        |

Figure 8:
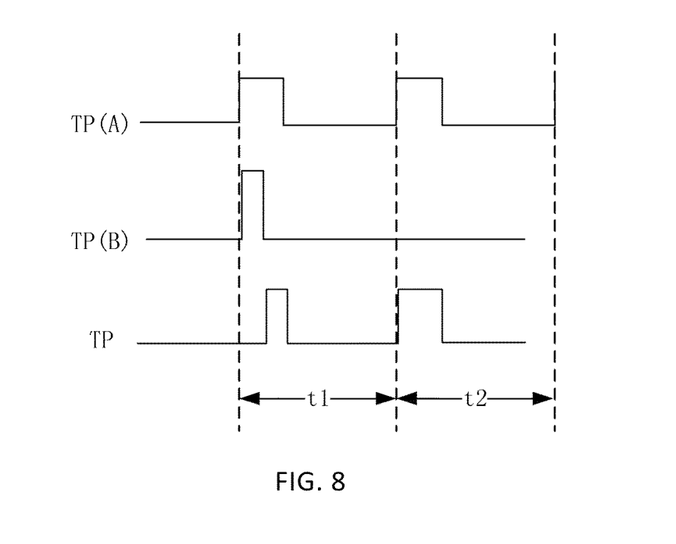
FIG. 8 is a schematic diagram of input signals and output signals of the XOR gate circuit shown in FIG. 7.

FIG. 8 shows a schematic diagram of waveforms of input signals TP(A) and TP(B), as well as an output signal TP for the XOR gate circuit shown in FIG. 7. In this example, the first drive control signal TP (A), the second drive control signal TP (B), and the adjusted drive control signal TP shown in FIG. 8 are all source drive control signals.

As can be seen from FIG. 8, the first drive control signal TP (A) generated based on the display data has the same pulse width and the same duty cycle. The second drive control signal TP (B) generated based on the difference between display brightnesses of neighboring rows has different pulse widths and duty cycles. After the XOR processing is performed on the first drive control signal and the second drive control signal, the generated adjusted source drive control signal has different duty cycles for different time periods (e.g., t1 and t2 time periods corresponding to different rows), which in turn causes different charging time for pixels of different rows.

It may be understood that although not shown, the processing principle of the source drive control signal and related signals before and after the processing shown in FIG. 8 are also applicable to the processing of the gate drive control signal.

In addition, although the XOR circuit is taken as an example, it may be understood that the present disclosure is not limited thereto, and any other applicable manner (for example, an applicable logic circuit such as an addition circuit or a subtraction circuit) may be employed to generate an adjusted drive control signal based on the first and second drive control signals. For example, for the TP (A) and TP (B) signals shown in FIG. 8, the same TP signal may also be obtained by a subtraction circuit. Alternatively or additionally, when the duty cycle of the first drive control signal needs to be increased (e.g., extend its pulse width), a drive control signal with a larger pulse width may be obtained by properly adjusting the pulse position or phase of the second drive control signal and then summating the two drive control signals.

In another alternative embodiment, the pixel drive control circuit 510 includes a timing controller. The timing controller is configured to obtain a signal generation instruction based on display data of the target columns of sub-pixels and corresponding target display brightnesses, and generate a corresponding second drive control signal based on the signal generation instruction.

Optionally, the signal generation instruction obtained by the timing controller may be input by a user. Alternatively, the signal generation instruction may be generated based on the charging time required for rows of sub-pixels in the target columns of sub-pixels, which is calculated by the timing controller based on the obtained display data of the target columns of sub-pixels and target display brightnesses. In some embodiments, the charging time is calculated based on a theoretical charging time corresponding to the display data and a time adjustment amount as a function of a difference between the target display brightnesses of neighboring rows of sub-pixels. For example, when the difference between the target display brightnesses indicates that there is a jump in the data voltage for neighboring rows of sub-pixels on the source line and thus might cause a data delay, a positive time adjustment amount may be added to the theoretical charging time so that the actual charging time is larger than the theoretical charging time, that is, the charging time is extended, so that the sub-pixels reach a desired display brightness.

In some embodiments, the charging time required for rows of sub-pixels in the target columns of sub-pixels may be calculated based on the difference between the target display brightnesses of the sub-pixels sequentially connected on the data line and belonging to neighboring rows, and the duty cycles of corresponding sub-drive control signals in the second drive control signal is determined based on the calculated charging time.

The pixel drive circuit 520 in the embodiment of the present disclosure is configured to output a pixel drive signal under the control of the adjusted drive control signal (for example, having different duty cycles). The pixel drive signal may control charging and discharging of the target columns of sub-pixels. The pixel drive signal includes sub-drive signals corresponding to the sub-drive control signals and having at least two duty cycles.

Optionally, the pixel drive circuit 520 is further configured to: control to charge the target columns of sub-pixels in a first charging period based on a sub-drive signal having a third duty cycle in the pixel drive signal, and control to charge the target columns of sub-pixels in a second charging period based on a sub-drive signal having a fourth duty cycle in the pixel drive signal. The third duty cycle is different from the fourth duty cycle, and the pixel charging time in the first charging period is different from the pixel charging time in the second charging period.

Optionally, the third duty cycle in the pixel drive signal corresponds to the first duty cycle in the drive control signal, and the fourth duty cycle corresponds to the second duty cycle in the drive control signal.

It may be understood that in the related art, when the pixel drive circuit charges pixels under control of an original drive control signal with a fixed duty cycle, the charging time consumed by undercharged sub-pixels is a first original charging time, and the charging time consumed by overcharged sub-pixels is a second original charging time. When the pixel drive control is implemented according to an embodiment of the present disclosure, the actual charging time for the undercharged sub-pixels will be greater than the first original charging time, and the actual charging time for the overcharged sub-pixels will be less than the second original charging time.

Further operational principles of the display panel, pixel drive control circuit 510, and pixel drive circuit 520 in the embodiments of the present disclosure may be illustrated with reference to method embodiments described below.

Figure 9:
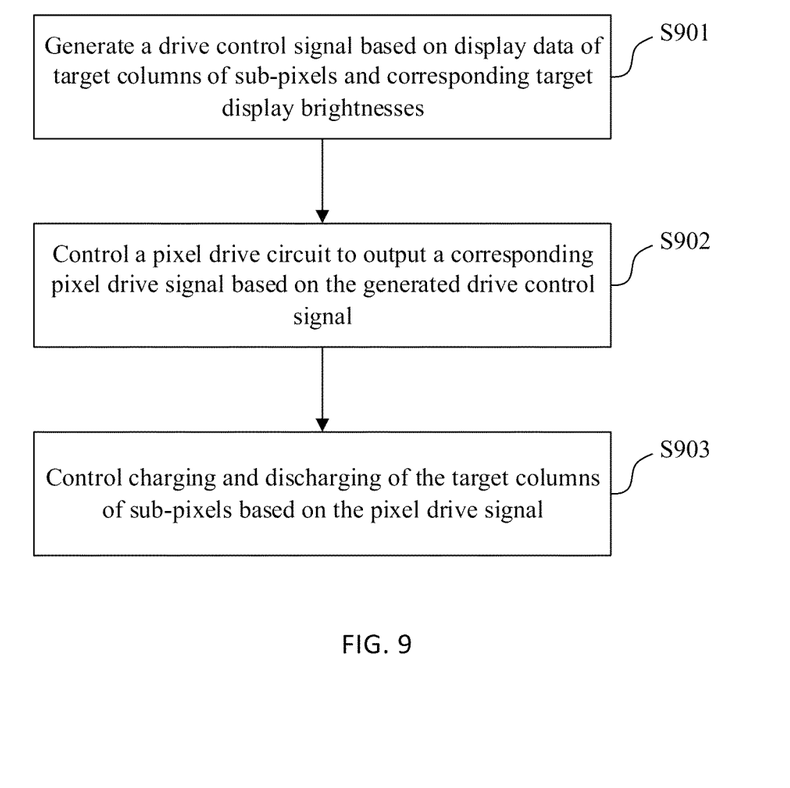
FIG. 9 is a flowchart of a pixel drive control method according to an embodiment of the present disclosure.

An embodiment of the present disclosure provides a pixel drive control method that may be performed by a pixel drive control circuit according to an embodiment of the present disclosure. As shown in FIG. 9, the method includes the following steps.

At 5901, a drive control signal is generated based on display data of target columns of sub-pixels and corresponding target display brightness. The drive control signal in the embodiment of the present disclosure includes sub-drive control signals having at least two duty cycles.

In an optional implementation, a first drive control signal is generated based on the display data of the target columns of sub-pixels, and a second drive control signal is obtained based on the target display brightnesses of the target columns of sub-pixels. The first drive control signal is adjusted based on the second drive control signal, to obtain an adjusted drive control signal including sub-drive control signals of the first duty cycle and the second duty cycle.

Optionally, the second drive control signal has a duty cycle that varies with the difference between the target display brightnesses.

Optionally, adjusting the first drive control signal based on the second drive control signal comprises: performing XOR processing on the first drive control signal and the second drive control signal.

Returning to FIG. 8, it may be seen from the figure that the first drive control signal TP(A) has a fixed duty cycle and the second drive control signal TP(B) has a variable duty cycle. The adjusted drive control signal TP includes two sub-drive control signals, namely a first sub-drive control signal S1 in a first time period t1 and a second sub-drive control signal S2 in a second time period t2. The first sub-drive control signal S1 has a first duty cycle, and the second sub-drive control signal S2 has a second duty cycle different from the first duty cycle.

In an optional implementation, a signal generation instruction based on display data of the target columns of sub-pixels and the target display brightnesses may be obtained, and a corresponding drive control signal is generated based on the signal generation instruction.

Optionally, the obtained signal generation instruction may be input by a user. Alternatively, the signal generation instruction may be generated based on the charging time required for rows of sub-pixels in the target columns of sub-pixels which is calculated by a timing controller based on the obtained display data of the target columns of sub-pixels and target display brightnesses.

In an optional implementation, obtaining the second drive control signal based on the target display brightnesses of the target columns of sub-pixels comprises: obtaining a signal generation instruction based on the target display brightnesses, and generating a corresponding second drive control signal according to the signal generation instruction.

In another optional implementation, obtaining the second drive control signal based on the target display brightnesses of the target columns of sub-pixels comprises: obtaining target display brightnesses of target sub-pixels, determining a duty cycle of the second drive control signal based on the target display brightnesses, and generating a corresponding second drive control signal based on the duty cycle of the second drive control signal.

At 5902, the pixel drive circuit is controlled to output a corresponding pixel drive signal based on the generated drive control signal. The pixel drive signal includes sub-drive signals having at least two duty cycles.

Optionally, the at least two duty cycles comprise a third duty cycle and a fourth duty cycle. The third duty cycle corresponds to a first duty cycle in the drive control signal, and the fourth duty cycle corresponds to a second duty cycle in the drive control signal.

When the generated drive control signal includes a gate drive control signal and a source drive control signal, and the pixel drive circuit includes a gate driving circuit and a source driving circuit, optionally, the gate driving circuit is controlled to output a corresponding gate drive signal based on the generated gate drive control signal, and the source driving circuit is controlled to output a corresponding source drive signal based on the generated source drive control signal.

Optionally, the pixel drive control method according to an embodiment of the present disclosure further includes the following steps:

At S903, charging and discharging of the target columns of sub-pixels are controlled based on the pixel drive signal.

Optionally, the pixel drive circuit is controlled so that charging of the target columns of sub-pixels in a first charging period is controlled based on the sub-drive signal having a third duty cycle in the pixel drive signal; and the pixel drive circuit is controlled so that charging of the target columns of sub-pixels in a second charging period is controlled based on the sub-drive signal having a fourth duty cycle in the pixel drive signal.

When the pixel drive circuit includes a gate driving circuit, optionally, the gate driving circuit is controlled so that turn-on of the target columns of sub-pixels in the first charging period is controlled based on the sub-drive signal having the third duty cycle in the gate drive signal; and turn-on of the target columns of sub-pixels in the second charging period is controlled based on the sub-drive signal having the fourth duty cycle in the gate drive signal.

Alternatively or additionally, when the pixel drive circuit includes a source driving circuit, the source driving circuit is controlled so that charging of the target columns of sub-pixels in the first charging period is controlled based on the sub-drive signal having the third duty cycle in the source drive signal; and the source driving circuit is controlled so that charging of the target column of sub-pixels in the second charging period is controlled based on the sub-drive signal having the fourth duty cycle in the source drive signal.

In some embodiments, the duty cycles of the sub-drive signals in the gate drive signal are arranged to be the same as the duty cycles of the sub-drive signals in the source drive signal. For example, both of them include the third duty cycle and the fourth duty cycle. This will enable good cooperation between the gate drive signal and the source drive signal to more accurately charge the sub-pixels.

In another optional implementation, the duty cycles of the sub-drive signals in the gate drive signal may be greater than the duty cycles of the sub-drive signals in the source drive signal. This will also enable cooperation of the gate drive signal and the source drive signal to implement charging of the sub-pixels.

Optionally, the third duty cycle is smaller than the fourth duty cycle, that is, an active level (e.g., high level) duration of the sub-drive signal having the third duty cycle is smaller than the active level duration of the sub-drive signal having the fourth duty cycle.

Based on the duty cycle and the original charging time described above, the pixel drive circuit is controlled to control charging of the target column of sub-pixels in the first charging period, that is, the pixel drive circuit is controlled to charge corresponding rows of sub-pixels which are originally likely to be overcharged in the target columns of sub-pixels, based on the sub-drive signal having the third duty cycle in the pixel drive signal, and the charging time reduces from the first original charging time to the active level duration corresponding to the third duty cycle.

The pixel drive circuit is controlled to control charging of the target column of sub-pixels in the second charging cycle, that is, the pixel drive circuit is controlled to charge corresponding rows of sub-pixels which are originally likely to be undercharged in the target column of sub-pixels, based on the sub-drive signal having the fourth duty cycle in the source drive signal, and the charging time increases from the second original charging time to the active level duration corresponding to the fourth duty cycle. It may be understood that since the original charging time may correspond to a pixel drive signal having a fixed duty cycle, the first original charging time and the second original charging time may have the same length of time.

It is to be noted that all the possibilities discussed with respect to FIG. 5-FIG. 8 are also valid for FIG. 9.

At least the following advantageous effects may be achieved by applying the technical solutions provided by the embodiments of the present disclosure.

Embodiments of the present disclosure can enable different rows of sub-pixels to be driven by signals having different duty cycles by generating a drive control signal including at least two duty cycles, thereby achieving adjustment of the charging time for different rows of sub-pixels, to reduce the charging difference of rows of sub-pixels caused by the conventional fixed charging time, so that the display brightnesses of the rows of sub-pixels tend to become uniform, and thereby improving the picture quality and user experience.

The embodiments of the present disclosure may adjust a generated first drive control signal (i.e., a drive control signal corresponding to the original fixed charging time) by using a second drive control signal based on the target display brightnesses, to obtain an adjusted drive control signal including sub-drive control signals having the first duty cycle and second duty cycle. As such, the adjustment of the charging time for any two rows of sub-pixels can be achieved to reduce the inter-row charging difference. This may reduce the need for external regulation and achieve automatic adjustment of the original drive control signal.

Embodiments of the present disclosure may implement the adjustment of the drive control signal through an XOR gate circuit. This adjustment method is simple and easy.

The second drive control signal according to the embodiments of the present disclosure may be generated by automatically calculating based on obtained target display brightness, or may be directly generated based on an input signal generation instruction. In this way, the automatic processing of the horizontal stripes of the picture can be achieved, and the picture quality processing based on the external control may also be achieved, thereby making it more convenient and flexible to cope with various picture quality problems.

Embodiments of the present disclosure further provides a computer readable storage medium on which a computer program is stored, wherein the computer program, when executed by a processor, implement the pixel drive control method provided by the embodiments of the present disclosure.

The computer readable medium includes, but is not limited to, any type of non-transitory computer readable medium, such as a disk (including floppy disk, hard disk, optical disk, CD-ROM, and magneto-optical disk), ROM (Read-Only Memory), RAM (Random Access Memory), EPROM (Erasable Programmable Read-Only Memory), EEPROM (Electrically Erasable Programmable Read Only Memory), flash memory, magnetic card or light card. That is, the readable medium includes any medium that can store or transmit information in a readable form by a device (e.g., a computer).

It should be appreciated by the person skilled in the art that the various operations, methods, steps in the flow, measures and schemes discussed in the present invention can be alternated, modified, combined or deleted. Furthermore, other operations, methods, steps in the flow, measures and schemes involving the various operations, methods, steps in the flow, measures and schemes discussed in the present invention may also be alternated, modified, rearranged, dissolved, combined or deleted. Furthermore, other operations, methods, steps in the flow, measures and schemes having the same functions with the various operations, methods, steps in the flow, measures and schemes discussed in the present invention may also be alternated, modified, rearranged, dissolved, combined or deleted.

The terms "first", "second", "third" and "fourth" are used for descriptive purposes only, and are not to be construed as indicating or implying a relative importance or implicitly indicating the number of technical features indicated. Thus, features defined with "first", "second", "third" and "fourth" may include one or more such features, either explicitly or implicitly. In the description of the present disclosure, "a plurality" means two or more unless otherwise stated.

It should be understood that although steps in the flowchart of the drawings are sequentially displayed as indicated by the arrows, these steps are not necessarily performed in the order indicated by the arrows. Except as explicitly stated herein, the execution of these steps is not strictly limited, and these steps may be performed in other sequences. Moreover, at least some of the steps in the flowchart of the drawings may include a plurality of sub-steps or stages, which are not necessarily performed at the same time, but may be performed at different time, and which are not certainly performed sequentially, but may be performed in turn or alternately with at least a portion of other steps or sub-steps or stages of other steps.

What are described above are only partial embodiments of the present disclosure. It should be appreciated that those skilled in the art can also make several improvements and modifications without departing from the principles of the present disclosure. The improvements and modifications should also be considered as falling within the scope of protection of the present disclosure.

What is claimed is:

1. A method for controlling driving of a plurality of pixels, each pixel of the plurality of pixels comprising sub-pixels, the method comprising:
    generating a drive control signal based on display data and corresponding target display brightnesses of a target column of sub-pixels connected by a data line for pixel driving, the drive control signal being a source drive control signal and comprising sub-drive control signals for respective ones of the target column of sub-pixels, the sub-driving control signals having adjustable duty cycles for a charging period in which the sub-pixels are charged; and
    controlling a source drive circuit to output a corresponding source drive signal based on the drive control signal, the source drive signal comprising sub-drive signals having duty cycles corresponding to respective ones of the sub-drive control signals,
    wherein said generating the drive control signal comprises adjusting, based on a difference between corresponding target display brightnesses of a first sub-pixel and a second sub-pixel of the target column of sub-pixels that belong to neighboring rows and sequentially connected by the data line, a duty cycle of a sub-drive control signal for the second sub-pixel, and increasing the duty cycle of the sub-drive signal for the second sub-pixel by increasing the duty cycle of the sub-drive control signal for the second sub-pixel when the difference exceeds a threshold so that charging time in the charging period for the second sub-pixel is larger than a theoretical charging time corresponding to display data for the second sub-pixel.

2. The method according to claim 1, wherein the target column of sub-pixels comprise odd rows of sub-pixels in a first column of sub-pixels and even rows of sub-pixels in a second column of sub-pixels connected by the data line, wherein the first column of sub-pixels and the second column of sub-pixels are two columns neighboring the data line and the first sub-pixel is in the first column and the second sub-pixel is in the second column, and wherein the generating the drive control signal comprises:
    generating an initial drive control signal based on the display data, the initial drive control signal comprising a first sub-drive control signal for the first sub-pixel and a second sub-drive control signal for the second sub-pixel; and
    adjusting a duty cycle of the second sub-drive control signal in the initial drive control signal based on the difference between the target display brightnesses of the first sub-pixel and the second sub-pixel to generate an adjusted drive control signal.

3. The method according to claim 2, wherein an adjustment proportion of the duty cycle of the second sub-drive control signal is determined based on the difference between the target display brightnesses.

4. The method according to claim 2, wherein the generating the drive control signal comprises:
    generating a first drive control signal based on the display data as the initial drive control signal;
    generating a second drive control signal based on the difference between the target display brightnesses; and
    adjusting the first drive control signal based on the second drive control signal to obtain the drive control signal comprising the sub-drive control signals including a sub-drive control signal of a first duty cycle and a sub-drive control signal of a second duty cycle.

5. The method according to claim 4, wherein the adjusting the first drive control signal based on the second drive control signal comprises:
    performing XOR processing on the first drive control signal and the second drive control signal.

6. The method according to claim 4, wherein the generating the second drive control signal based on the difference between the target display brightnesses comprises:
    calculating a length of charging time for said second sub-pixel based on the difference between the target display brightnesses, and
    determining the duty cycle of the second sub-drive control signal in the second drive control signal based on the length of charging time that was calculated.

7. An apparatus for controlling driving of a plurality of pixels, each of the plurality of pixels comprising sub-pixels, the apparatus comprising:
    a signal generator configured to generate a drive control signal based on display data and corresponding target display brightnesses of a target column of sub-pixels connected by a data line for pixel driving, and the drive control signal being a source drive control signal and comprising sub-drive control signals for respective ones of the target column of sub-pixels, the sub-driving control signals having adjustable duty cycles for a charging period in which the sub-pixels are charged; and
    a signal transmitter configured to transmit the drive control signal to a source drive circuit to control the source drive circuit to output a corresponding source drive signal, the source drive signal comprising sub-drive signals having duty cycles corresponding to respective ones of the sub-drive control signals,
    wherein the signal generator is further configured to adjust, based on a difference between the target display brightnesses of a first sub-pixel and a second sub-pixel of the target column of sub-pixels that belong to neighboring rows and sequentially connected by the data line, a duty cycle of a sub-drive control signal for the second sub-pixel, and increasing the duty cycle of the sub-drive signal for the second sub-pixel by increasing the duty cycle of the sub-drive control signal for the second sub-pixel when the difference exceeds a threshold so that charging time in the charging period for the second sub-pixel is larger than a theoretical charging time corresponding to display data for the second sub-pixel.

8. The apparatus according to claim 7,
wherein the target columns of the sub-pixels comprise odd rows of the sub-pixels in a first column of the sub-pixels and even rows of the sub-pixels in a second column of the sub-pixels connected by the data line,
wherein the first column and the second column are two columns neighboring the date line and the first sub-pixel is in the first column and the second sub-pixel is in the second column,
wherein the signal generator is configured to generate an initial drive control signal based on the display data, the initial drive control signal comprising a first sub-drive control signal for the first sub-pixel and a second sub-drive control signal for the second sub-pixel, and adjust a duty cycle of the second sub-drive control signal in the initial drive control signal based on the difference between the target display brightnesses of the first sub-pixel and the second sub-pixel to generate an adjusted drive control signal.

9. The apparatus according to claim 8, wherein the signal generator is configured to determine an adjustment proportion of the duty cycle of the second sub-drive control signal based on the difference between the target display brightnesses.

10. The apparatus according to claim 8, wherein the signal generator comprises:
a timing controller configured to generate a first drive control signal based on the display data as the initial drive control signal, and generate a second drive control signal based on the difference between the target display brightnesses; and
a signal adjustment circuit configured to adjust the first drive control signal based on the second drive control signal to obtain the drive control signal comprising the sub-drive control signals including a sub-drive control signal of a first duty cycle and a sub-drive control signal of a second duty cycle.

11. The apparatus according to claim 10, wherein the signal adjustment circuit comprises a XOR gate circuit configured to perform XOR processing on the first drive control signal and the second drive control signal to generate the adjusted drive control signal.

12. A display panel, comprising:
pixels, each of the pixels comprising a plurality of sub-pixels;
a source drive circuit configured to charge and discharge the sub-pixels based on a source drive signal; and
the apparatus according to claim 7 for providing the source drive signal to the source drive circuit.

13. The display panel according to claim 12,
wherein the source drive circuit is configured to control charging of the target column of the sub-pixels in a first charging period based on a sub-drive signal of the sub-drive signals having a third duty cycle in the source drive signal, and control charging of the target column of sub-pixels in a second charging period based on a sub-drive signal of the sub-drive signals having a fourth duty cycle in the source drive signal,
wherein the third duty cycle is different from the fourth duty cycle, and
wherein a first charging time in the first charging period is different from a second charging time in the second charging period.

14. A non-transitory computer readable storage medium, wherein a computer program is stored in the non-transitory computer readable storage medium, and the computer program, when executed by a processor, implements the method according to claim 1.

* * * * *